(12) United States Patent
Ito et al.

(10) Patent No.: US 11,421,306 B2
(45) Date of Patent: Aug. 23, 2022

(54) CEMENTED CARBIDE, COATED TOOL, AND CUTTING TOOL

(71) Applicant: KYOCERA CORPORATION, Kyoto (JP)

(72) Inventors: Hirotoshi Ito, Satsumasendai (JP); Kou Ri, Satsumasendai (JP); Tadashi Katsuma, Satsumasendai (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 17/042,983

(22) PCT Filed: Mar. 29, 2019

(86) PCT No.: PCT/JP2019/014032
§ 371 (c)(1),
(2) Date: Sep. 29, 2020

(87) PCT Pub. No.: WO2019/189775
PCT Pub. Date: Oct. 3, 2019

(65) Prior Publication Data
US 2021/0017632 A1     Jan. 21, 2021

(30) Foreign Application Priority Data

Mar. 29, 2018   (JP) .............................. JP2018-064086

(51) Int. Cl.
*C22C 29/08*   (2006.01)
*B23B 27/14*   (2006.01)
(Continued)

(52) U.S. Cl.
CPC .............. *C22C 29/08* (2013.01); *B23B 27/14* (2013.01); *B23C 5/16* (2013.01); *C23C 16/32* (2013.01);
(Continued)

(58) Field of Classification Search
CPC ....... C22C 29/08; B23B 27/14; B23B 27/148; B23B 2222/28; C23C 16/34; C23C 16/36; C23C 16/403
(Continued)

(56) References Cited

U.S. PATENT DOCUMENTS 5,580,666 A * 12/1996 Dubensky ............... C22C 29/08
  428/546
6,756,110 B2 * 6/2004 Shibata .................. C23C 30/005
  407/119

(Continued)

FOREIGN PATENT DOCUMENTS

CN     106856658 A     6/2017
JP     2003129165 A    5/2003
(Continued)

*Primary Examiner* — Archene A Turner
(74) *Attorney, Agent, or Firm* — Viering, Jentschura & Partner mbB

(57) ABSTRACT

A cemented carbide may include a hard phase that may include W and C, a first solid solution phase and a second solid solution phase, each of which may include W, C, Ti and Zr, and a binder phase that may include an iron group metal. The cemented carbide may include 1.0-3.0 mass % of the Ti in terms of TiC, and 0.75-2.0 mass % of the Zr in terms of ZrC. An amount of the Ti in terms of TiC may be more than 1 time and less than three times an amount of the Zr in terms of ZrC. The first solid solution phase may satisfy a relationship of $0.1 \leq \text{Ti}/(\text{Ti}+\text{Zr}) < 0.4$ in terms of atomic ratio. The second solid solution phase satisfies a relationship of $0.7 \leq \text{Ti}/(\text{Ti}+\text{Zr}) \leq 0.9$ in terms of atomic ratio.

7 Claims, 3 Drawing Sheets

(51) Int. Cl.
  *B23C 5/16* (2006.01)
  *C23C 16/32* (2006.01)
  *C23C 16/34* (2006.01)
  *C23C 28/04* (2006.01)
  *C23C 16/36* (2006.01)
  *C23C 16/40* (2006.01)

(52) U.S. Cl.
  CPC .............. *C23C 16/34* (2013.01); *C23C 16/36* (2013.01); *C23C 16/403* (2013.01); *C23C 28/044* (2013.01); *B23B 2222/28* (2013.01)

(58) Field of Classification Search
  USPC ........................................................ 428/698
  See application file for complete search history.

(56) References Cited

U.S. PATENT DOCUMENTS

| 6,797,369 B2 * | 9/2004 | Usami ...................... B24D 3/06 |
| | | 428/212 |
| 2017/0259344 A1 | 9/2017 | Detani et al. |

FOREIGN PATENT DOCUMENTS

| JP | 2003277873 A | 10/2003 |
| JP | 2017113835 A | 6/2017 |
| WO | 2017061058 A1 | 4/2017 |

* cited by examiner

_US 11,421,306 B2_

CEMENTED CARBIDE, COATED TOOL, AND CUTTING TOOL

CROSS-REFERENCE TO RELATED APPLICATIONS

This application is a national stage entry according to 35 U.S.C. 371 of PCT Application No. PCT/JP2019/014032 filed on Mar. 29, 2019, which claims priority to Japanese Application No. 2018-064086 filed on Mar. 29, 2018, which are entirely incorporated herein by reference.

TECHNICAL FIELD

The present disclosure relates to a cemented carbide, a coated tool, and a cutting tool.

BACKGROUND

A cemented carbide including WC as a hard phase can be used for sliding components for which wear resistance is required, and a material for tools designed to machine metals or the like. A cemented carbide including a solid solution phase can be used as a cemented carbide used for a tool. Patent Document 1 discusses that strength and toughness at high temperatures can be enhanced by using two kinds of solid solution phases that include Ti, Zr and C and are different in content ratio of Ti and Zr, and by respectively controlling a range of Ti/(Ti+Zr) within a range of $0.4 \leq \text{Ti}/(\text{Ti}+\text{Zr}) \leq 0.6$ and $0.7 \leq \text{Ti}/(\text{Ti}+\text{Zr}) \leq 0.9$ in the individual solid solution phases. The enhanced strength and toughness at high temperatures contribute to increasing sliding speed and machining speed in the sliding components and the tools.

Patent Document 1: Japanese Unexamined Patent Publication No. 2003-277873

SUMMARY

A cemented carbide in the present disclosure may include a hard phase including W and C, a first solid solution phase, a second solid solution phase, and a binder phase including an iron group metal. The first solid solution phase may include W, C, Ti and Zr in which Ti/(Ti+Zr) is less than 0.5 in terms of atomic ratio. The second solid solution phase may include W, C, Ti and Zr in which Ti/(Ti+Zr) is 0.5 or more in terms of atomic ratio. The cemented carbide in the present disclosure may include 1.0-3.0 mass % of the Ti in terms of TiC, and 0.75-2.0 mass % of the Zr in terms of ZrC. An amount of the Ti in terms of TiC may be more than 1 time and less than three times an amount of the Zr in terms of ZrC. An average value of Ti/(Ti+Zr) in terms of atomic ratio may be 0.1 or more and less than 0.4 in the first solid solution phase. An average value of Ti/(Ti+Zr) in terms of atomic ratio may be 0.7 or more and 0.9 or less in the second solid solution phase.

A coated tool in the present disclosure may include the cemented carbide and a coating layer for covering the cemented carbide. A cutting tool in the present disclosure may include a holder that is extended from a first end toward a second end and includes a pocket on a side of the first end, and the coated tool located in the pocket.

DETAILED DESCRIPTION

Figure 1:
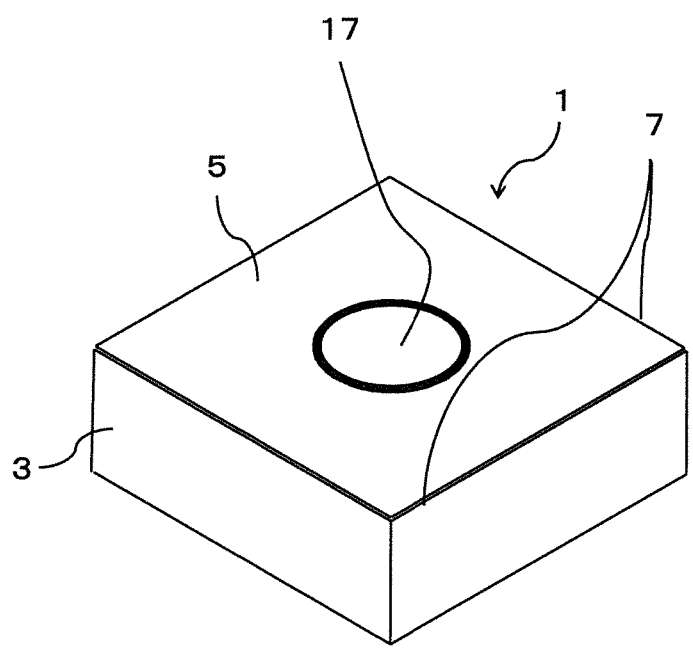
FIG. 1 is a perspective view illustrating a non-limiting embodiment of a coated tool in the present disclosure.

A cemented carbide in the present disclosure includes a hard phase including W and C, a first solid solution phase, a second solid solution phase, and a binder phase including an iron group metal. The first solid solution phase includes W, C, Ti and Zr in which Ti/(Ti+Zr) is less than 0.5 in terms of atomic ratio. The second solid solution phase includes W, C, Ti and Zr in which Ti/(Ti+Zr) is 0.5 or more in terms of atomic ratio. The cemented carbide in the present disclosure includes 1.0-3.0 mass % of the Ti in terms of TiC, and 0.75-2.0 mass % of the Zr in terms of ZrC. An amount of Ti in terms of TiC is more than 1 time and less than three times an amount of Zr in terms of ZrC. The first solid solution phase satisfies a relationship that an average value of Ti/(Ti+Zr) in terms of atomic ratio is 0.1 or more and less than 0.4. The second solid solution phase satisfies a relationship that an average value of Ti/(Ti+Zr) in terms of atomic ratio is 0.7 or more and 0.9 or less.

The hard phase in the cemented carbide includes W and C and is composed mainly of WC in the present disclosure. The hard phase is composed of WC particles, and may include 90 mass % or more of WC and the rest that is other solid solution elements. Examples of the solid solution elements include Al or Cr. The presence of the above hard phase can be determined if a peak due to WC crystals is detected by X-ray diffraction.

The cemented carbide may include 80-95 mass % of the hard phase in the present disclosure. This range leads to hardness suitable for use as a coated tool. The cemented carbide may include particularly 90-95 mass % of the hard phase.

Alternatively, the cemented carbide in the present disclosure includes a first solid solution phase and a second solid solution phase. The first solid solution phase includes W, C, Ti and Zr in which Ti/(Ti+Zr) is less than 0.5 in terms of atomic ratio. The second solid solution phase includes W, C, Ti and Zr in which Ti/(Ti+Zr) is 0.5 or more in terms of atomic ratio.

Including W and C is common to both the hard phase and the first and second solid solution phases. A total content of W and C included in the first solid solution phase and that included in the second solid solution phase is 65 mass % or less. The first solid solution phase and the second solid solution phase are different from the hard phase in content of W and C.

The first solid solution phase includes a larger amount of Zr than Ti. The second solid solution phase includes a larger amount of Ti than the first solid solution phase.

The first solid solution phase and the second solid solution phase are a so-called β phase. The first solid solution phase and the second solid solution phase are individually composed of one or more kinds selected from among carbides, nitrides and/or carbonitrides of at least one kind of metal element selected from the group of metals of the periodic tables 4A, 5A and 6A groups. These phases include at least W, Ti, Zr and C as described above.

The first solid solution phase and the second solid solution phase have a peak different from that of WC crystal by X-ray diffraction.

Compositions of the first solid solution phase and the second solid solution phase are measurable by energy dispersive X-ray spectroscopy (EDS) under a scanning electron microscope (SEM) or transmission electron microscope (TEM).

Alternatively, the cemented carbide further includes a binder phase including an iron group metal, such as Ni and Co, in the present disclosure.

Because these components are different in composition, it is easy to distinguish them by combining the SEM and elementary analysis with an element distribution analysis. Alternatively, the compositions may be measured using the TEM.

The cemented carbide having the above components have enhanced strength and toughness at high temperatures. The cemented carbide therefore has excellent wear resistance even if a sliding speed is increased. It is also possible to increase a machining speed if used for a coated tool.

The cemented carbide may include 1.5-2.5 mass % of Ti in terms of TiC, and 1.0-1.5 mass % of Zr in terms of ZrC in the present disclosure. Hardness and strength at high temperatures can be improved by including Ti and Zr within the above range, and enhanced lifetime is attainable without causing plastic deformation if used for a high speed cutting.

A ratio (V1/(V1+V2)) of a volume ratio (V1) of the first solid solution phase to a sum of the volume ratio (V1) of the first solid solution phase and a volume ratio (V2) of the second solid solution phase may be set to 0.05 to 0.3 in a cross section of the cemented carbide in the present disclosure.

The cemented carbide has particularly enhanced strength and toughness at high temperatures by controlling the ratio within the above range, and offers excellent plastic deformation resistance in machining at a high sliding speed and a high machining speed.

As to the volume ratios (V1, V2) measured here, an area ratio of the first solid solution phase is taken as V1, and an area ratio of the second solid solution is taken as V2 in a cross section SEM or the like of the cemented carbide.

The first solid solution phase and the second solid solution phase may include Ta. A total amount of W and Ta included in the first solid solution phase may be larger than a total amount of W and Ta included in the second solid solution phase. This constitution leads to high temperature characteristics of the second solid solution phase, and the second solid solution phase is therefore less subjected to plastic deformation even in high speed machining.

Lattice constants of the first solid solution phase and the second solid solution phase may be 4.38-4.39 Å. A Zr component that is a solid-solute in the β phase can be optimized by controlling the lattice constants within the above range, and the high temperature characteristics can be improved without decreasing ambient temperature hardness. The lattice constants are measured using Rietveld analysis. A crystalline phase of cubic, Fm-3m and No. 225 was used as a model in the analysis.

A coated tool includes a coating layer located on a surface of the cemented carbide in the present disclosure. FIG. 1 is a perspective view illustrating a non-limiting embodiment of the coated tool in the present disclosure. The coated tool 1 in the present disclosure has a plate shape whose main surface has an approximately quadrangular shape in the non-limiting embodiment illustrated in FIG. 1. However, there is no intention to limit to this shape. An upper surface is a rake surface in FIG. 1, and a side surface is a flank surface in FIG. 1. A cutting edge 7 is formed on a ridge part between the upper surface and the side surface. In other words, the coated tool includes the cutting edge 7 located on at least a part of a ridgeline where the rake surface intersects with the flank surface.

Although the entirety of an outer periphery of the rake surface may correspond to the cutting edge 7 in the coated tool 1, the coated tool 1 is not limited to the above. For example, the cutting edge 7 may be located on only one side or may be located partially on the quadrangular-shaped rake surface.

Dimensions of the coated tool 1 are not particularly limited. For example, a length of one side of the rake surface is settable to approximately 3-20 mm. A thickness of the coated tool 1 is settable to, for example, approximately 3-20 mm.

The coated tool 1 may include a through hole 17 extended from the upper surface to the lower surface in FIG. 1.

Figure 2:
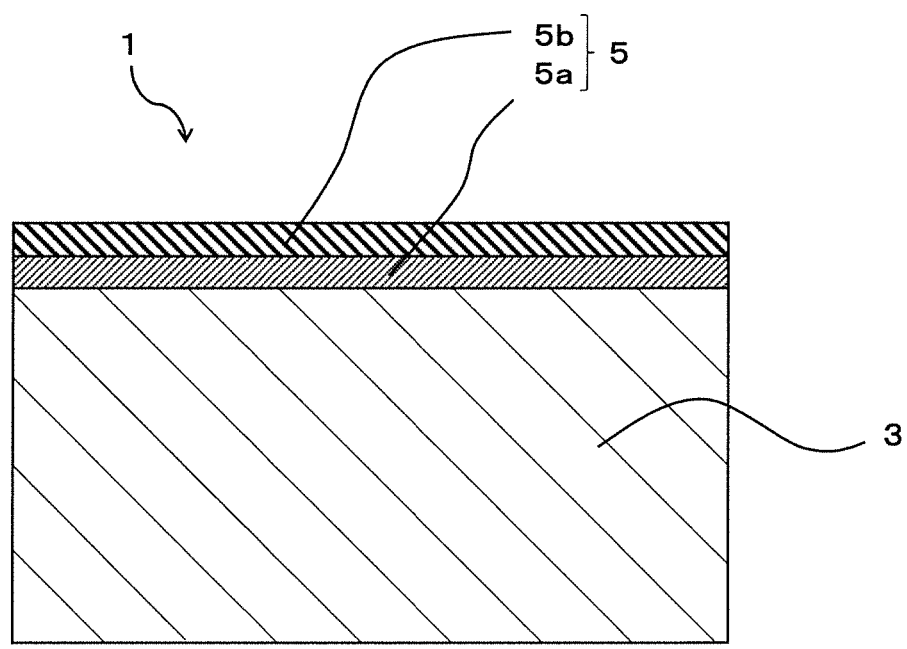
FIG. 2 is an enlarged cross sectional view illustrating surroundings of a surface of the coated tool in the present disclosure.

The coated tool 1 includes the coating layer 5 on a surface of the base body 3 composed of the cemented carbide in the present disclosure as illustrated in FIG. 2. The coating layer 5 located on the surface of the base body 3 can be formed by PVD or CVD.

The coating layer 5 may be a multilayer, and may include, for example, a TiCN layer 5a and an $Al_2O_3$ layer 5b in this order from a side of the base body 3.

Alternatively, the coating layer 5 may include, for example, a TiN layer (not illustrated), a TiCN layer 5a and an $Al_2O_3$ layer 5b in this order from the side of the base body 3. The coated tool 1 employs, as the base body 3, the cemented carbide less susceptible to plastic deformation, and further includes the coating layer 5 in the present disclosure. The coated tool 1 is therefore suitable for high speed machining. The coating layer 5 may not cover the entire surface of the base body 3, but may cover at least a part of the surface of the base body 3, particularly a surface of a region used as the cutting edge 7.

Figure 3:
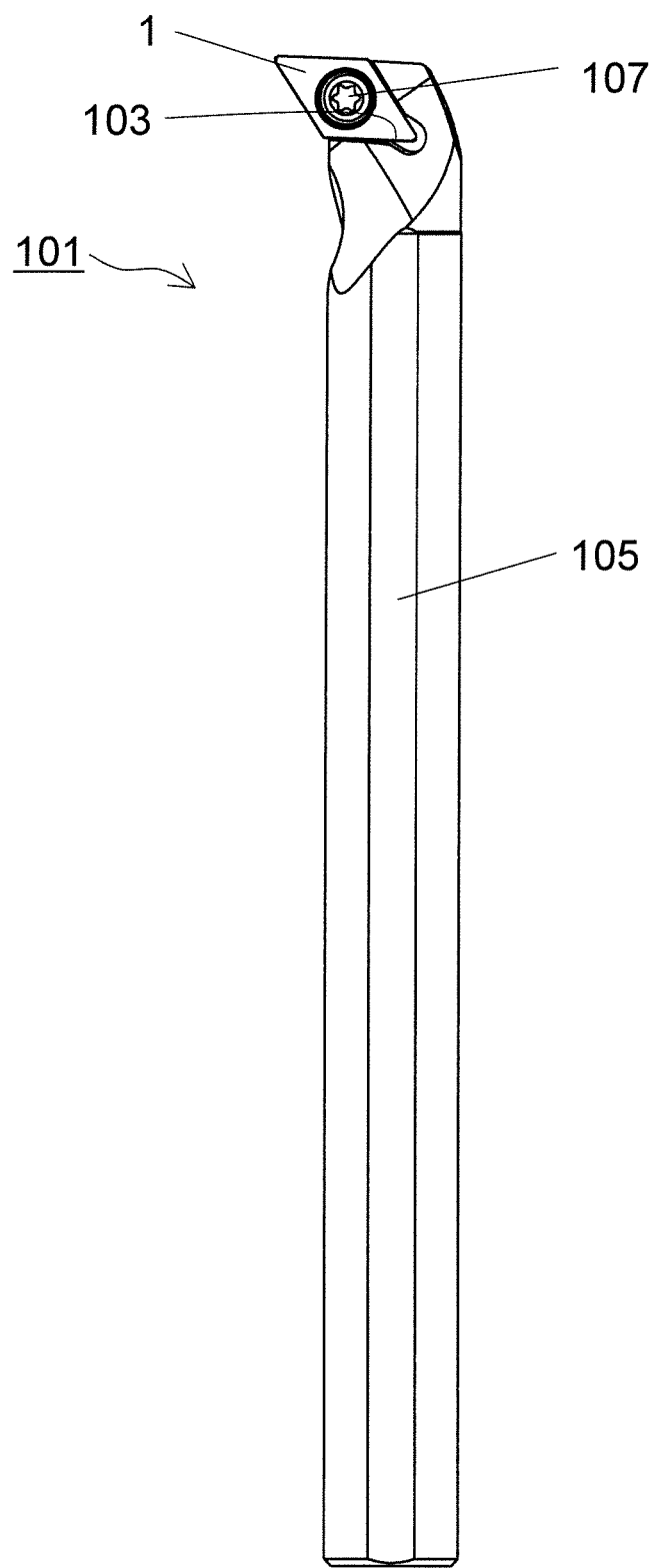
FIG. 3 is a plan view illustrating a non-limiting embodiment of a cutting tool in the present disclosure.

A cutting tool in the present disclosure is described with reference to the drawings. The cutting tool 101 has, for example, a bar-shaped body extended from the first end (an upper end in FIG. 3) toward the second end (a lower end in FIG. 3) in the present disclosure as illustrated in FIG. 3. The cutting tool 101 includes a holder 105 including a pocket 103 on a side of the first end (a front end side), and the coated tool 1 located in the pocket 103 as illustrated in FIG. 3. The cutting tool 101 includes the coated tool 1 and is therefore capable of carrying out a stable cutting process over a long term.

The pocket 103 is a part that permits attachment of the coated tool 1. The pocket 103 includes a seating surface parallel to a lower surface of the holder 105, and a constraining lateral surface inclined relative to the seating surface. The pocket 103 opens into a side of the first end of the holder 105.

The coated tool 1 is located in the pocket 103. A lower surface of the coated tool 1 may be in a direct contact with the pocket 103. Alternatively, a sheet (not illustrated) may be held between the coated tool 1 and the pocket 103.

The coated tool 1 is attached to the holder 105 so that at least a part of a region used as the rake surface and the cutting edge 7 is protruded outward from the holder 105. The coated tool 1 is attached to the holder 105 by a screw 107 in the present non-limiting embodiment. Specifically, the coated tool 1 is attachable to the holder 105 in such a manner that screw parts are engaged with each other by inserting the screw 107 into the through hole 17 of the coated tool 1, and by inserting a front end of the screw 107 into a screw hole (not illustrated) formed in the pocket 103.

For example, steel and cast iron are usable as a material of the holder 105. Of these materials, high toughness steel may be used.

The present non-limiting embodiment has illustrated and described the cutting tool 101 for use in a so-called turning process. Examples of the turning process include inner diameter processing, outer diameter processing and grooving process. The cutting tool 101 is not limited to ones which are used for the turning process. For example, the coated tool 1 of the above non-limiting embodiment is applicable to a cutting tool for use in a milling process.

A method for manufacturing the cemented carbide in the present disclosure is described below.

TiC powder, ZrC powder, WC powder, TaC powder and NbC powder are prepared as raw material powders. A mean particle diameter of the raw material powders may be suitably selected in a range of 0.1-10 μm.

The TiC powder is controlled within a range of 1.0-3.0 mass %. ZrC is controlled within a range of 0.75-2.0 mass %. It is here necessary to make an amount of TiC larger than an amount of ZrC in a non-limiting embodiment.

The TaC powder may be controlled within 0-5 mass %. The WC powder is controlled within 80-95 mass %, and the rest is Co powder.

These raw material powders are mixed together and molded, followed by debinding treatment. This is sintered at 1450-1600° C. for 30-180 minutes in a non-oxidizing atmosphere, such as vacuum, argon atmosphere and nitrogen atmosphere, thereby obtaining the cemented carbide in the present disclosure.

The cutting tool in the present disclosure is obtainable by bringing the cemented carbide into a shape of the cutting tool.

The sliding properties and wear resistance of the cutting tool can be improved by depositing the coating layer on the cemented carbide in the shape of the cutting tool by CVD method.

As the coating layer deposited by CVD method, 3-15 μm of a TiCN layer and 1-15 μm of an $Al_2O_3$ layer may be formed on a surface of the cemented carbide in this order from a side of the cemented carbide.

Alternatively, 0.1-1.5 μm of a TiN layer, 3-15 μm of a TiCN layer and 1-15 μm of an $Al_2O_3$ layer may be formed on the surface of the cemented carbide in this order from the side of the cemented carbide.

EXAMPLES

Examples of the present disclosure are specifically described below.

Cemented carbides respectively having compositions presented in Table 1 were prepared by mixing WC powder, Co powder, ZrC powder, TiC powder, TaC powder and NbC powder together in their respective proportions, and by leaving a molded body thus prepared at a temperature of 1520° C. for two hours, followed by sintering.

TABLE 1

| Sample No. | WC | TiC | ZrC | Co | NbC | TaC | Ti/(Ti + Zr) of first solid solution phases | Volume ratio of first solid solution (V1) | Volume ratio of second solid solution (V2) | V1/(V1+V2) | Displacement in creep test (mm) | Wear test result (minutes) | Fracture test result (times) |
|---|---|---|---|---|---|---|---|---|---|---|---|---|---|
| 1 | 90.95 | 0.8 | 0.75 | 7.5 | 0 | 0 | 0.28 | 1.32 | 2.36 | 0.36 | −0.115 | 21 | 8000 |
| 2 | 90.9 | 1 | 0.6 | 7.5 | 0 | 0 | 0.39 | 1.02 | 2.94 | 0.26 | −0.117 | 20 | 3000 |
| 3 | 89.5 | 1 | 2 | 7.5 | 0 | 0 | 0.11 | 3.49 | 2.89 | 0.55 | −0.073 | 33 | 500 |
| 4 | 90.75 | 1 | 0.75 | 7.5 | 0 | 0 | 0.31 | 1.28 | 2.90 | 0.31 | −0.072 | 34 | 8000 |
| 5 | 90 | 2 | 0.5 | 7.5 | 0 | 0 | 0.35 | 0.30 | 5.69 | 0.05 | −0.119 | 19 | 5000 |
| 7 | 89 | 2 | 1.5 | 7.5 | 0 | 0 | 0.17 | 2.47 | 5.58 | 0.31 | −0.072 | 34 | 8000 |
| 8 | 88.4 | 2.1 | 2 | 7.5 | 0 | 0 | 0.14 | 3.39 | 5.95 | 0.38 | −0.075 | 30 | 7000 |
| 9 | 88.5 | 2 | 2 | 7.5 | 0 | 0 | 0.14 | 3.59 | 5.98 | 0.37 | −0.072 | 34 | 2500 |
| 10 | 87.5 | 3 | 2 | 7.5 | 0 | 0 | 0.38 | 3.42 | 8.79 | 0.28 | −0.06 | 39 | 11000 |
| 11 | 87 | 3.5 | 2 | 7.5 | 0 | 0 | 0.44 | 3.33 | 10.16 | 0.25 | −0.125 | 16 | 7000 |
| 12 | 87 | 3 | 2.5 | 7.5 | 0 | 0 | 0.09 | 4.32 | 8.74 | 0.33 | −0.06 | 18 | 2000 |
| 13 | 89.5 | 2.25 | 0.75 | 7.5 | 0 | 0 | 0.4 | 1.18 | 6.80 | 0.15 | −0.11 | 24 | 7000 |
| 14 | 89.3 | 3 | 0.2 | 7.5 | 0 | 0 | 0.46 | 0.28 | 8.93 | 0.03 | −0.129 | 14 | 1000 |
| 15 | 88.5 | 2 | 1 | 7.5 | 1 | 0 | 0.23 | 1.71 | 6.06 | 0.22 | −0.068 | 38 | 11000 |
| 16 | 87.5 | 2 | 1 | 7.5 | 2 | 0 | 0.23 | 1.70 | 6.06 | 0.22 | −0.069 | 37 | 12000 |
| 17 | 88.5 | 2 | 1 | 7.5 | 0 | 1 | 0.23 | 1.70 | 6.06 | 0.22 | −0.066 | 40 | 9000 |
| 18 | 87.5 | 2 | 1 | 7.5 | 0 | 2 | 0.23 | 1.70 | 6.06 | 0.22 | −0.068 | 38 | 11000 |
| 19 | 86.5 | 2 | 1 | 7.5 | 0 | 3 | 0.23 | 1.70 | 6.06 | 0.22 | −0.069 | 36 | 13000 |
| 20 | 88 | 2 | 1 | 6 | 1 | 1 | 0.23 | 1.70 | 5.08 | 0.22 | −0.06 | 42 | 8000 |
| 21 | 85 | 2 | 1 | 10 | 1 | 1 | 0.23 | 1.70 | 6.08 | 0.22 | −0.077 | 30 | 12000 |

Mean particle diameters of the raw material powders were as follows. The mean particle diameter of WC was 3 μm, that of Co was 1.5 μm, and those of TiC, ZrC, TaC and NbC were all 1 μm. Their respective compositions are indicated by converting elements included in a sintered body to compounds in Table 1. Obtained cemented carbides were evaluated by a high temperature creep test under the following conditions.

<High Temperature Creep Test>

Temperature: 900° C.

Load: 9 kN

Atmosphere: Argon

Evaluation Method: Measuring displacement if the load was held for four hours

Additionally, samples in the shape of CNMG120408 were individually formed using the compositions presented in Table 1, and 0.5 μm of TiN nitride, 7 μm of TiCN and 5 μm of $Al_2O_3$ film were respectively deposited. Cutting performance of the samples were evaluated under the following conditions.

<Cutting Test>

(1) Fracture Resistance Evaluation

Cutting Condition

Machining Type: Turning

Cutting Speed: 300 m/min

Feed: 0.3 mm/rev
Depth of Cut: 1.5 mm
Workpiece: SCM440 Round rod of φ200 with four grooves
Machining State: WET
Evaluation Item: The number of impacts at which a fracture occurred (2) Wear Resistance Evaluation
Cutting Condition
Machining Type: Turning
Cutting Speed: 300 m/min
Feed: 0.3 mm/rev
Depth of Cut: 2.0 mm
Workpiece: SCM435 Round rod of φ200
Machining State: WET
Evaluation Item: Cutting time at which a flank surface wear width reached 0.3 mm Because all the second solid solution phases of the prepared samples satisfied a relationship that an average value of Ti/(Ti+Zr) was 0.7 or more and 0.9 or less in terms of atomic ratio, this was not presented in Table 1 and omitted here. Samples Nos. 4, 7, 8, 10 and 15-21, each satisfying constituent features of the present disclosure, had small displacement in the creep test and a small amount of wear, and there was a long time until occurrence of a fracture. The results show that the cemented carbide in the present disclosure is usable at high sliding speed and machining speed.

While the non-limiting embodiments in the present disclosure have been described, the present disclosure is not limited to the above non-limiting embodiments, and various improvements and changes may be made without departing from the spirit and scope of the present disclosure.

DESCRIPTION OF THE REFERENCE NUMERALS 1 coated tool
3 base body
5 coating layer
5a TiCN layer
5b Al$_2$O$_3$ layer
17 through hole
101 cutting tool
103 pocket
105 holder
107 screw

What is claimed is:

1. A cemented carbide, comprising:
a hard phase comprising W and C;
a first solid solution phase comprising W, C, Ti, and Zr in which Ti/(Ti+Zr) is less than 0.5 in terms of atomic ratio;
a second solid solution phase comprising W, C, Ti, and Zr in which Ti/(Ti+Zr) is 0.5 or more in terms of atomic ratio; and
a binder phase comprising an iron group metal,
wherein
a total content of Ti in the cemented carbide is ranging from 1.0 to 3.0 mass % in terms of TiC,
a total content of Zr in the cemented carbide is ranging from 0.75 to 2.0 mass % in terms of ZrC,
an amount of the TiC is more than 1 time and less than three times an amount of the ZrC,
an average value of Ti/(Ti+Zr) in terms of atomic ratio is 0.1 or more and less than 0.4 in the first solid solution phase, and
an average value of Ti/(Ti+Zr) in terms of atomic ratio is 0.7 or more and 0.9 or less in the second solid solution phase.

2. The cemented carbide according to claim 1, comprising 1.5-2.5 mass % of the Ti in terms of TiC, and 0.9-1.4 mass % of the Zr in terms of ZrC.

3. The cemented carbide according to claim 1, wherein a ratio (V1/(V1+V2)) of a volume ratio (V1) of the first solid solution phase to a sum of the volume ratio (V1) of the first solid solution phase and a volume ratio (V2) of the second solid solution phase is 0.05 to 0.3 in a cross section of the cemented carbide.

4. A coated tool, comprising:
the cemented carbide according to claim 1; and
a coating layer located on a surface of the cemented carbide.

5. The coated tool according to claim 4, wherein the coating layer comprises a TiCN layer and an Al$_2$O$_3$ layer in this order from a side of the cemented carbide.

6. The coated tool according to claim 4, wherein the coating layer comprises a TiN layer, a TiCN layer, and an Al$_2$O$_3$ layer in this order from a side of the cemented carbide.

7. A cutting tool, comprising:
a holder that is extended from a first end toward a second end and comprises a pocket on a side of the first end; and
the coated tool according to claim 4, the coated tool being located in the pocket.

* * * * *